(12) United States Patent
Huang

(10) Patent No.: US 11,923,831 B2
(45) Date of Patent: Mar. 5, 2024

(54) BOOTSTRAPPED SWITCH

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/828,516

(22) Filed: May 31, 2022

(65) Prior Publication Data
US 2023/0091800 A1   Mar. 23, 2023

(30) Foreign Application Priority Data

Sep. 23, 2021 (TW) ................................. 110135350

(51) Int. Cl.
| | |
|---|---|
| *H03K 17/06* | (2006.01) |
| *H03K 17/0412* | (2006.01) |
| *H03K 19/017* | (2006.01) |

(52) U.S. Cl.
CPC ...... *H03K 17/063* (2013.01); *H03K 17/04123* (2013.01); *H03K 19/01735* (2013.01)

(58) Field of Classification Search
CPC ........... H03K 17/063; H03K 17/04123; H03K 19/01735; H03K 19/01714
See application file for complete search history.

(56) References Cited

U.S. PATENT DOCUMENTS

| | | |
|---|---|---|
| 11,070,207 B2 | 7/2021 | Huang |
| 11,581,884 B1 * | 2/2023 | Huang ................ H03K 17/063 |
| 2006/0202736 A1 | 9/2006 | Aksin |
| 2021/0105014 A1 | 4/2021 | Huang |

FOREIGN PATENT DOCUMENTS

TW          202116019 A        4/2021

* cited by examiner

*Primary Examiner* — Jung Kim
(74) *Attorney, Agent, or Firm* — WPAT, P.C

(57) ABSTRACT

A bootstrapped switch includes a first transistor, a second transistor, a first capacitor, three switches, and a switch circuit. The switch circuit includes a first switch, a second switch, a second capacitor, and a resistor. The first transistor receives the input voltage and outputs the output voltage. The first terminal of the second transistor receives the input voltage, and the second terminal of the second transistor is coupled to the first terminal of the first capacitor. The control terminal of the first switch receives a clock. The second switch is coupled between the control terminal of the first transistor and the first switch. The second capacitor is coupled between the control terminal of the first switch and the control terminal of the second switch. The resistor is coupled between the control terminal of the second switch and a reference voltage.

5 Claims, 9 Drawing Sheets

BOOTSTRAPPED SWITCH

BACKGROUND OF THE INVENTION

1. Field of the Invention

The present invention generally relates to bootstrapped switches.

2. Description of Related Art

FIG. 1 is a circuit diagram of a conventional bootstrapped switch. The bootstrapped switch 10 includes a switch 101, a switch 102, a switch 103, a switch 104, a switch 105, and an N-channel metal-oxide-semiconductor field-effect transistor (N-channel MOSFET, hereinafter referred to as NMOS transistor) 106, and a bootstrap capacitor 107. The input terminal VI and the output terminal VO of the bootstrapped switch 10 are respectively coupled to the source and drain of the NMOS transistor 106. The gate of the NMOS transistor 106 is coupled to the voltage source V3 through the switch 105 as well as coupled to one terminal of the bootstrap capacitor 107 and one terminal of the switch 101 through the switch 104. The other terminal of the switch 101 is coupled to the voltage source V1. The other terminal of the bootstrap capacitor 107 is coupled to the voltage source V2 through the switch 102 and coupled to the source of the NMOS transistor 106 and the input terminal VI of the bootstrapped switch 10 through the switch 103. The voltage source V1 is at a high voltage level VDD, while the voltage source V2 and the voltage source V3 are at the ground level. The operation of the bootstrapped switch 10 is known to people having ordinary skill in the art and thus omitted for brevity.

The state of the switch 105 (being turned on or off) determines the state of the NMOS transistor 106 (being turned on or off). In other words, when a response time of the switch 105 is shorter (i.e., the gate of the NMOS transistor 106 is driven to reach the target voltage faster), the state of the NMOS transistor 106 is more in line with the system clock, which means that the bootstrapped switch 10 performs better (e.g., operating faster and generating more accurate samplings). In other words, the design of the switch 105 is crucial to the performance of the bootstrapped switch 10.

SUMMARY OF THE INVENTION

In view of the issues of the prior art, an object of the present invention is to provide bootstrapped switches, so as to make an improvement to the prior art.

According to one aspect of the present invention, a bootstrapped switch that receives an input voltage and outputs an output voltage is provided. The bootstrapped switch includes a first transistor, a first capacitor, a second transistor, a first switch, a second switch, a third switch, a fourth switch, a fifth switch, a second capacitor, and a resistor. The first transistor has a first terminal, a second terminal, and a first control terminal. The first transistor receives the input voltage at the first terminal and outputs the output voltage at the second terminal. The first capacitor has a third terminal and a fourth terminal. The second transistor has a fifth terminal, a sixth terminal, and a second control terminal. The second transistor receives the input voltage at the fifth terminal. The sixth terminal is electrically connected to the third terminal of the first capacitor. The second control terminal is electrically connected to the first control terminal of the first transistor. The first switch is coupled between the third terminal of the first capacitor and a first reference voltage. The second switch is coupled between the fourth terminal of the first capacitor and a second reference voltage. The third switch is coupled between the fourth terminal of the first capacitor and the first control terminal of the first transistor. The fourth switch is coupled to the first control terminal of the first transistor and having a third control terminal. The fifth switch is coupled between the fourth switch and the first reference voltage and has a fourth control terminal. The second capacitor has a seventh terminal and an eighth terminal. The seventh terminal is coupled to the third control terminal, and the eighth terminal is coupled to the fourth control terminal. The resistor is coupled between the third control terminal and the second reference voltage.

According to another aspect of the present invention, a bootstrapped switch that receives an input voltage and outputs an output voltage is provided. The bootstrapped switch includes a first transistor, a capacitor, a second transistor, a first switch, a second switch, a third switch, a fourth switch, a fifth switch, a sixth switch, a resistor, and a logic circuit. The first transistor has a first terminal, a second terminal, and a first control terminal. The first transistor receives the input voltage at the first terminal and outputs the output voltage at the second terminal. The capacitor has a third terminal and a fourth terminal. The second transistor has a fifth terminal, a sixth terminal, and a second control terminal. The second transistor receives the input voltage at the fifth terminal. The sixth terminal is electrically connected to the third terminal of the capacitor. The second control terminal is electrically connected to the first control terminal of the first transistor. The first switch is coupled between the third terminal of the capacitor and a first reference voltage. The second switch is coupled between the fourth terminal of the capacitor and a second reference voltage. The third switch is coupled between the fourth terminal of the capacitor and the first control terminal of the first transistor. The fourth switch is coupled to the first transistor and has a third control terminal. The fifth switch is coupled between the fourth switch and the first reference voltage and has a fourth control terminal. The sixth switch is coupled between the third control terminal and a third reference voltage and has a fifth control terminal. The resistor is coupled between the third control terminal and the second reference voltage. The logic circuit has a first input terminal and a first output terminal. The first output terminal is coupled to the fifth control terminal. The fourth control terminal receives a clock. The first input terminal of the logic circuit receives the clock or an inverted signal of the clock.

The bootstrapped switches of the present invention can be turned off rapidly. In comparison with the prior art, the bootstrapped switches of the present invention can operate at a higher speed.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes bootstrapped switches. On account of that some or all elements of the bootstrapped switches could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
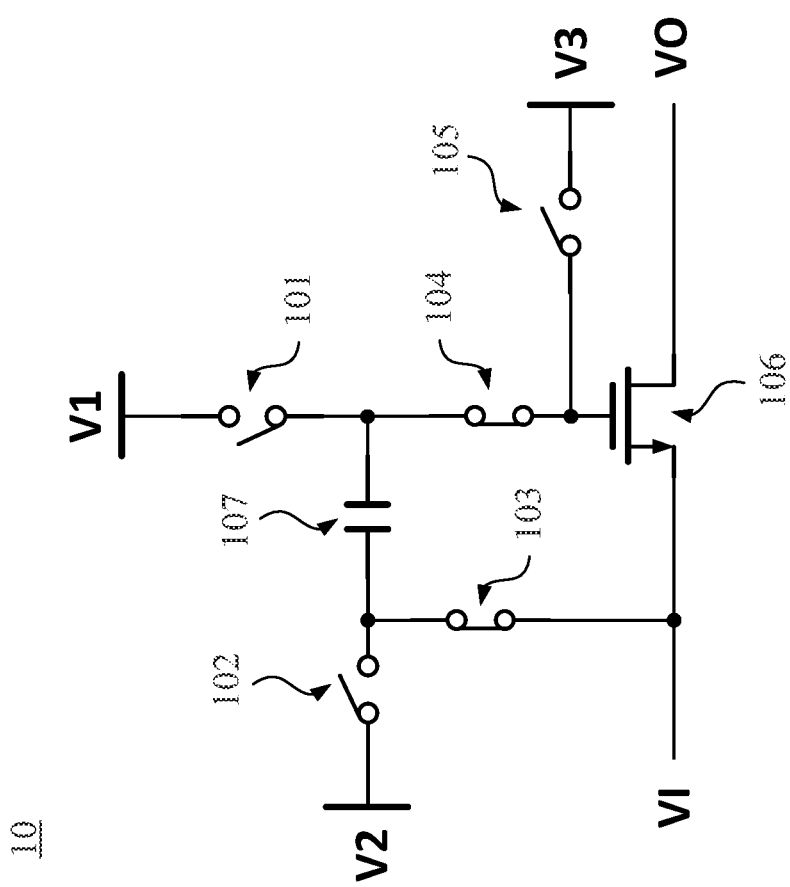
FIG. 1 is a circuit diagram of a conventional bootstrapped switch.
Figure 2:
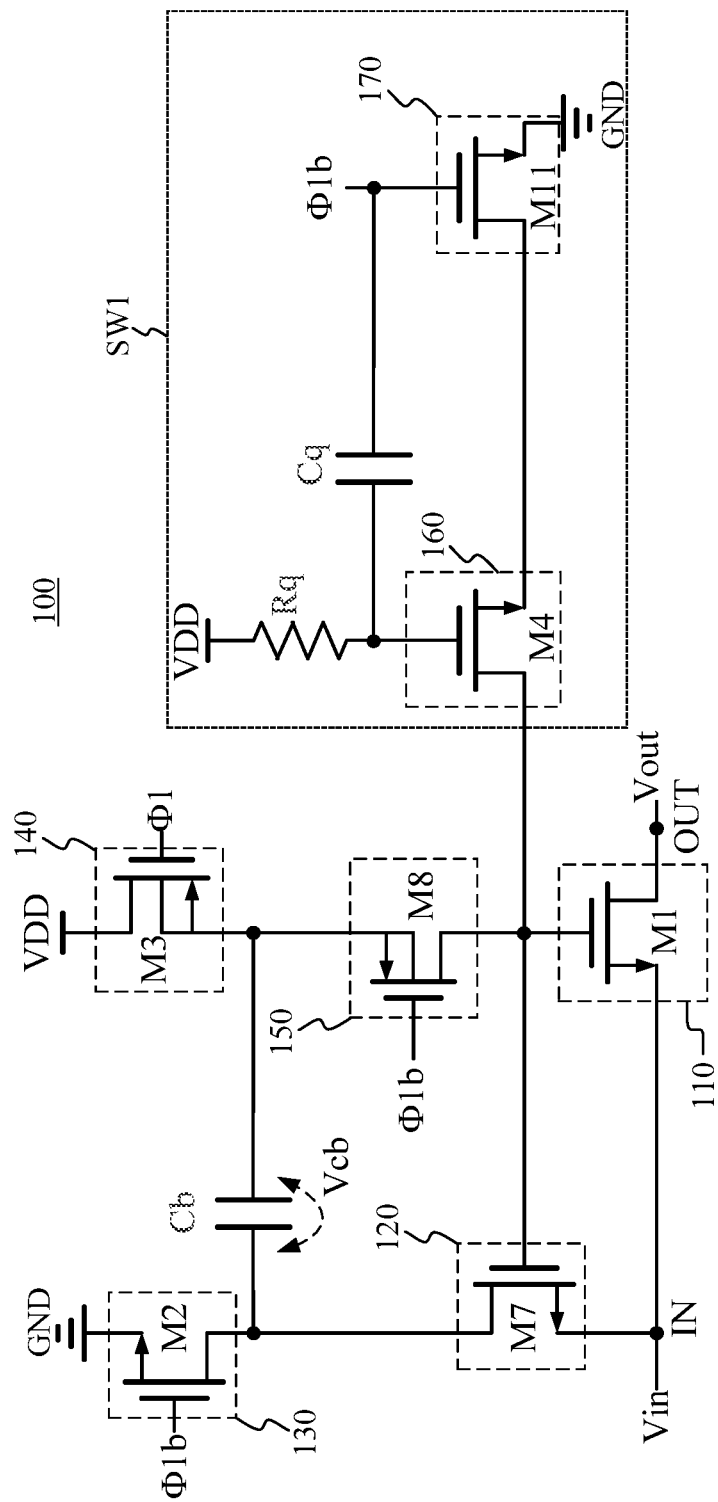
FIG. 2 is a circuit diagram of a bootstrapped switch according to an embodiment of the present invention.

FIG. 2 is a circuit diagram of a bootstrapped switch according to an embodiment of the present invention. The bootstrapped switch 100 receives the input voltage Vin at the input terminal IN and outputs the output voltage Vout at the output terminal OUT. The bootstrapped switch 100 includes a switch 110, a switch 120, a switch 130, a switch 140, a switch 150, a switch 160, a switch 170, a bootstrap capacitor Cb, a capacitor Cq, and a resistor Rq. The switch circuit SW1 corresponds to the switch 105 of FIG. 1. The switch 110, the switch 120, the switch 130, the switch 140, the switch 150, the switch 160, and the switch 170 can be respectively embodied by a transistor M1, a transistor M7, a transistor M2, a transistor M3, a transistor M8, a transistor M4, and a transistor M11. Each transistor has a first terminal, a second terminal, and a control terminal, and the first terminal and the second terminal are two terminals of a switch embodied by the transistor. For Metal-Oxide-Semiconductor Field-Effect Transistors (MOSFETs), the first terminal can be one of the source and the drain, the second terminal can be the other of the source and the drain, and the control terminal is the gate. For bipolar junction transistors (BJTs), the first terminal can be one of the collector and the emitter, the second terminal can be the other one of the collector and the emitter, and the control terminal is the base.

As shown in FIG. 2, the control terminal of the transistor M1 and the control terminal of the transistor M7 are electrically connected to each other. The transistor M1 receives the input voltage Vin at its first terminal, and outputs the output voltage Vout at its second terminal. The first terminal of the transistor M7 receives the input voltage Vin, and the second terminal of the transistor M7 is electrically connected to the first terminal of the bootstrap capacitor Cb. The first terminal of the transistor M2 is coupled to the first terminal of the bootstrap capacitor Cb, and the second terminal of the transistor M2 is coupled to the first reference voltage (the ground level GND in the example of FIG. 2). The first terminal of the transistor M3 is coupled to the second reference voltage (the power supply voltage VDD in the example of FIG. 2, which is higher than the ground level GND), and the second terminal of the transistor M3 is coupled to the second terminal of the bootstrap capacitor Cb. The first terminal of the transistor M8 is coupled to the control terminal of the transistor M1, and the second terminal of the transistor M8 is coupled to the second terminal of the bootstrap capacitor Cb. The first terminal of the transistor M4 is coupled or electrically connected to the control terminal of the transistor M1 and the control terminal of the transistor M7. The control terminal of the transistor M4 is coupled to the second reference voltage (the power supply voltage VDD) through the resistor Rq and also coupled to the first terminal of the capacitor Cq. The first terminal of the transistor M11 is coupled to the second terminal of the transistor M4, the second terminal of the transistor M11 is coupled or electrically connected to the first reference voltage (the ground level GND), and the control terminal of the transistor M11 is coupled to the second terminal of the capacitor Cq. The control terminal of the transistor M11 receives the clock $\Phi 1b$.

Figure 3:
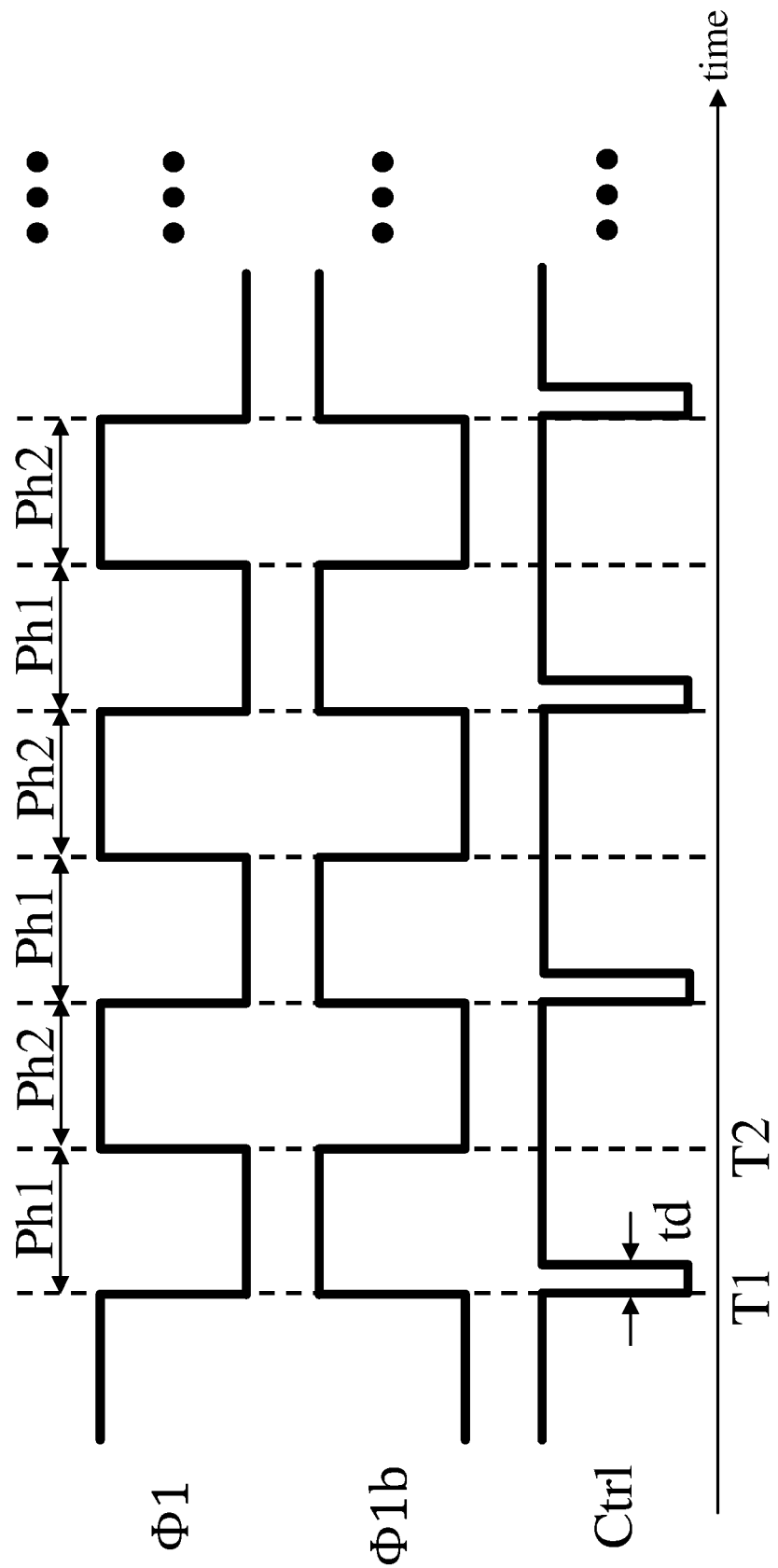
FIG. 3 shows an example of clock $\Phi 1$ and clock $\Phi 1b$.

The switch 130, the switch 140, the switch 150, and the switch 170 are turned on (the corresponding transistor is turned on) or off (the corresponding transistor is turned off) according to the clock $\Phi 1$ and the clock $\Phi 1b$. FIG. 3 shows an example of the clock $\Phi 1$ and the clock $\Phi 1b$, which are each other's inverted signal. Controlled by the clock $\Phi 1$ and the clock $\Phi 1b$, the bootstrapped switch 100 operates alternately in the first clock phase Ph1 (the period when the clock $\Phi 1$ is at the first level (e.g., the low level) and the clock $\Phi 1b$ is at the second level (e.g., the high level)) and the second clock phase Ph2 (the period when the clock $\Phi 1$ is at the second level and the clock $\Phi 1b$ is at the first level). The operational details of the bootstrapped switch 100 are discussed below.

Reference is made to FIGS. 2 and 3. In the first clock phase Ph1 (when the clock $\Phi 1$ is at the low level and the clock $\Phi 1b$ is at the high level), the switch 130, the switch 140, the switch 160, and the switch 170 are turned on, and the switch 150 is turned off. When the switch 160 and the switch 170 are turned on, the voltage at the control terminal of the transistor M1 and the control terminal of the transistor M7 is substantially equal to the first reference voltage (the ground level GND), driving the switch 110 and the switch 120 to be off; in other words, the switch 110 and the switch 120 are turned off in the first clock phase Ph1. When the switch 130 and the switch 140 are turned on, the voltages at the two terminals of the bootstrap capacitor Cb are substantially the first reference voltage (the ground level GND) and the second reference voltage (the power supply voltage VDD), respectively; in other words, the bootstrap capacitor Cb is charged in the first clock phase Ph1, and the voltage Vcb across the bootstrap capacitor Cb after the first clock phase Ph1 ends is substantially equal to the voltage difference between the first reference voltage and the second reference voltage.

In the second clock phase Ph2 (when the clock $\Phi 1$ is at the high level and the clock $\Phi 1b$ is at the low level), the switch 130, the switch 140, the switch 160, and the switch 170 are turned off, and the switch 150 is turned on. When the switch 150 is turned on, the electric potential at the control terminals of the transistor M1 and the transistor M7 is substantially equal to the electric potential at the second terminal of the bootstrap capacitor Cb; as a result, the transistor M1 and the transistor M7 are turned on due to the voltage Vcb across the bootstrap capacitor Cb. When the transistor M7 is turned on, the voltage at the second terminal of the bootstrap capacitor Cb and the control terminal of the transistor M1 is substantially equal to the sum of the input voltage Vin and the voltage Vcb across the bootstrap capacitor Cb. When the transistor M1 is turned on, the output voltage Vout is substantially equal to the input voltage Vin; namely, the bootstrapped switch 100 is turned on.

The voltage at the control terminal of the transistor M1 may be greater than the power supply voltage VDD (even close to twice the power supply voltage VDD). One of the purposes of the transistor M4 is to separate the control terminal of the transistor M1 and the transistor M11 to prevent the first terminal of the transistor M11 from being subjected to this high voltage. Because the control terminal of the transistor M4 is coupled or electrically connected to the power supply voltage VDD, the transistor M4 can withstand this high voltage. Unfortunately, the transistor M4 slows down the voltage transition (from the second level (e.g., the high level) to the first level (e.g., the low level)) at the control terminal of the transistor M1, hindering the bootstrapped switch 100 from being immediately turned off after entering the first clock phase Ph1.

One of the purposes of the capacitor Cq and the resistor Rq is to instantaneously boost the voltage at the control terminal of the switch 160, thereby increasing the switching speed of the transistor M4 (i.e., increasing the voltage transition speed at the control terminal of the transistor M1). When the clock Φ1b is at the first level (i.e., the second clock phase Ph2), the transistor M11 is turned off, and the capacitor Cq is charging. When the clock Φ1b transitions from the first level to the second level (e.g., at the time point T1 in FIG. 3), the voltage across the capacitor Cq is helpful in the instantaneous boost of the voltage at the control terminal of the transistor M4, thereby enhancing the turn-on capability of the transistor M4 so that the transistor M4 is turned on faster. When the clock Φ1b is at the second level (i.e., the first clock phase Ph1), the voltage at the control terminal of the transistor M4 gradually approaches the second reference voltage. In other words, the transistor M4 is turned on faster due to the voltage across the capacitor Cq. As a result, the voltage at the control terminal of the transistor M1 decreases more rapidly, meaning that the bootstrapped switch 100 is turned off more rapidly.

Figure 4:
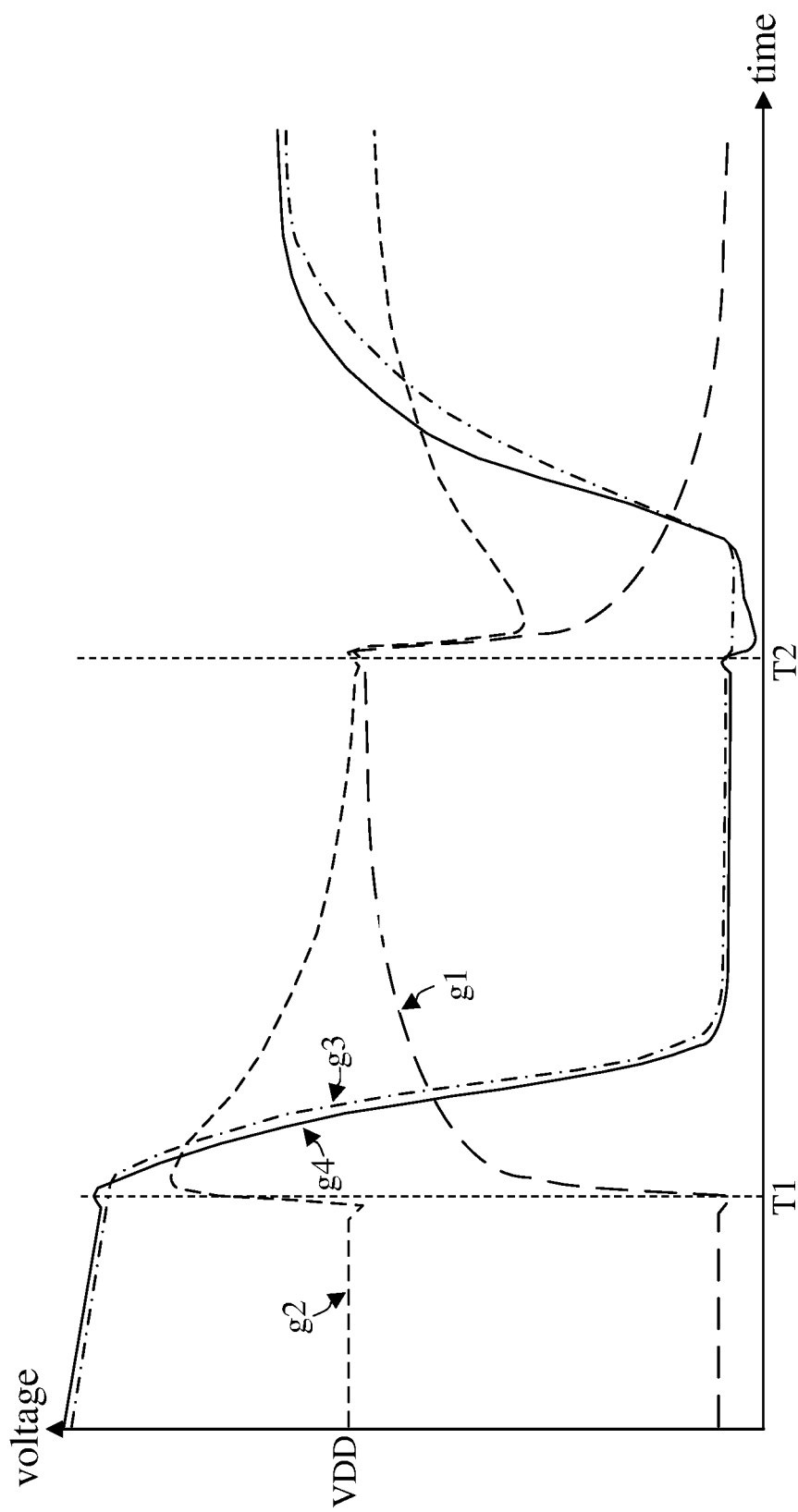
FIG. 4 is a simulation of the voltages at several nodes of the bootstrapped switch.

FIG. 4 is a simulation of the voltages at several nodes of the bootstrapped switch of FIG. 2. The curve g1 is the voltage at the control terminal of the transistor M11, the curve g2 is the voltage at the control terminal of the transistor M4, and the curve g3 and the curve g4 are the voltage at the control terminal of the transistor M1. The curve g3 corresponds to a bootstrapped switch that does not include the capacitor Cq and the resistor Rq, while curve g4 corresponds to a bootstrapped switch that includes the capacitor Cq and the resistor Rq (e.g., the bootstrapped switch 100). At the time point T1, the clock Φ1b transitions from the low level to the high level; therefore, the voltage at the control terminal of the transistor M11 (i.e., the curve g1) starts to rise, and the voltage at the control terminal of the transistor M4 (i.e., the curve g2) is boosted (the magnitude of the boost is equal to or close to the voltage across the capacitor Cq). Then, the voltage at the control terminal of the transistor M11 (i.e., the curve g1) and the voltage at the control terminal of the transistor M4 (i.e., the curve g2) gradually become stable (approximately equal to the power supply voltage VDD at the time point T2). The time point T1 and the time point T2 is about 0.2 nanoseconds apart (meaning that the bootstrapped switch 100 operates at a considerably high speed); however, even within this short period of time, the effect of the capacitor Cq and the resistor Rq can still be observed (i.e., the curve g4 reaches the low level earlier than the curve g3).

Figure 5:
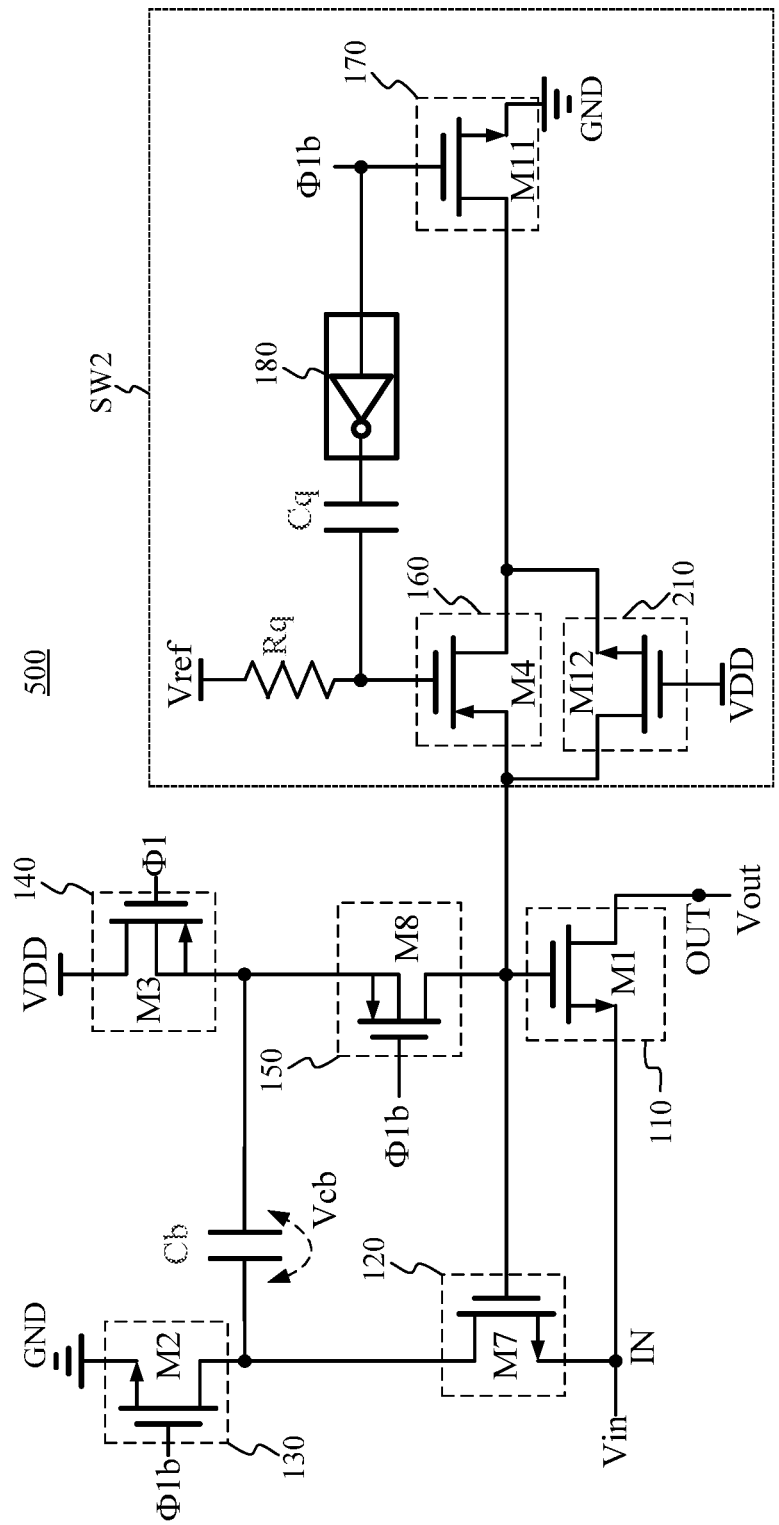
FIG. 5 is a circuit diagram of a bootstrapped switch according to another embodiment of the present invention.

FIG. 5 is a circuit diagram of a bootstrapped switch according to another embodiment of the present invention. The bootstrapped switch 500 is similar to the bootstrapped switch 100, except that the transistor M4 is embodied by a P-channel MOSFET (hereinafter referred to as PMOS transistor), and the bootstrapped switch 500 further includes the switch 210 embodied by the transistor M12. Because the transistor M4 is embodied by the PMOS transistor, the bootstrapped switch 500 further includes the inverter circuit 180. The inverter circuit 180 includes an odd number of inverters (in the circuit of FIG. 5, one inverter is shown as an example). The input terminal of the inverter circuit 180 receives the clock Φ1b, and the output terminal of the inverter circuit 180 is coupled or electrically connected to the capacitor Cq. The inverter circuit 180, the capacitor Cq, and the resistor Rq are helpful in the rapid fall of the voltage at the control terminal of the transistor M4, so that the transistor M4 is turned on more rapidly, which in turn pulls down the voltage at the control terminal of the transistor M1 more rapidly. The transistor M12 is an NMOS transistor. The first terminal of the transistor M12 is coupled to the control terminal of the transistor M1 and the control terminal of the transistor M7, the second terminal of the transistor M12 is coupled to the first terminal of the transistor M11, and the control terminal of the transistor M12 is coupled to the second reference voltage (e.g., the power supply voltage VDD). The resistor Rq is coupled to the third reference voltage Vref (VDD<Vref<2*VDD). The switch circuit SW2 corresponds to the switch 105 of FIG. 1.

Figure 6:
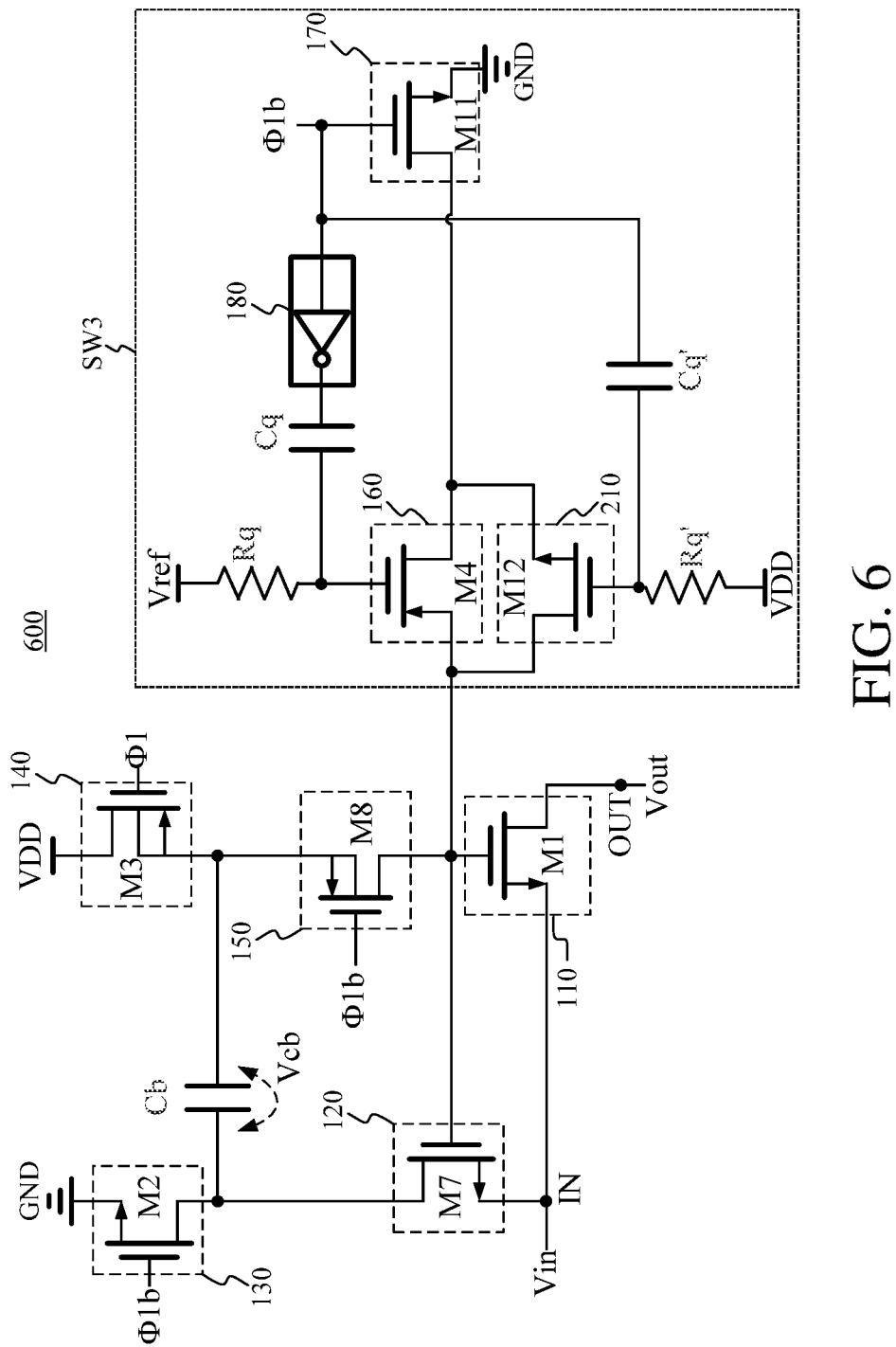
FIG. 6 is a circuit diagram of a bootstrapped switch according to another embodiment of the present invention.

FIG. 6 is a circuit diagram of a bootstrapped switch according to another embodiment of the present invention. The bootstrapped switch 600 is similar to the bootstrapped switch 500, except that the bootstrapped switch 600 further includes a capacitor Cq' and a resistor Rq'. The resistor Rq' is coupled between the control terminal of the transistor M12 and the second reference voltage (e.g., the power supply voltage VDD). The first terminal of the capacitor Cq' is coupled or electrically connected to the control terminal of the transistor M12, and the second terminal of the capacitor Cq' is coupled or electrically connected to the control terminal of the transistor M11. The capacitor Cq' and the resistor Rq' are helpful in turning on the transistor M12 more rapidly; therefore, the voltage at the control terminal of the transistor M1 can decrease more rapidly, meaning that the switching speed of the bootstrapped switch 100 is increased. The switch circuit SW3 corresponds to the switch 105 of FIG. 1.

Figure 7:
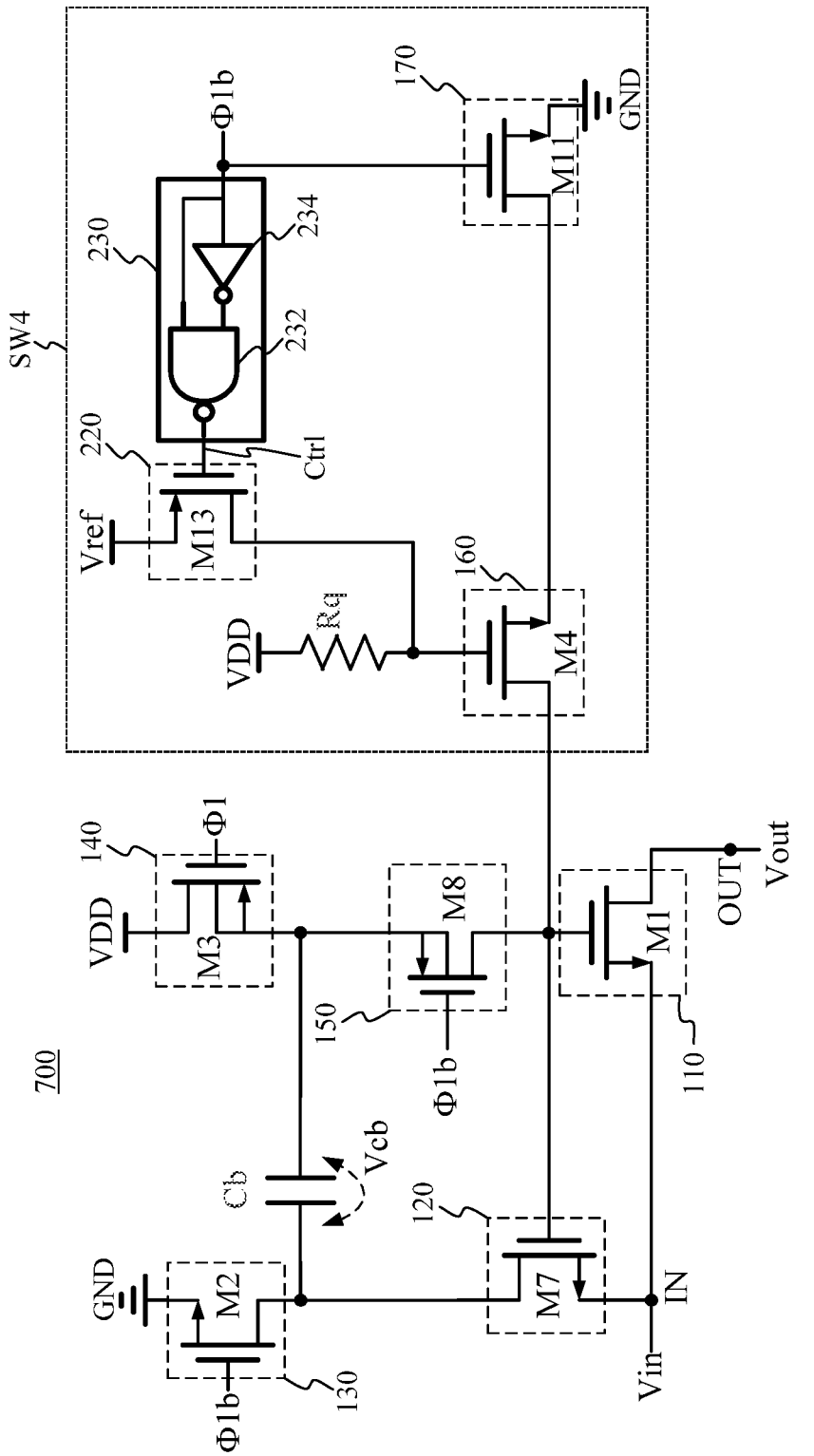
FIG. 7 is a circuit diagram of a bootstrapped switch according to another embodiment of the present invention.

FIG. 7 is a circuit diagram of a bootstrapped switch according to another embodiment of the present invention. The bootstrapped switch 700 is similar to the bootstrapped switch 100, except that the bootstrapped switch 700 does not include the capacitor Cq but includes the switch 220 and the logic circuit 230. The switch 220 is embodied by the transistor M13. The first terminal of the transistor M13 is coupled or electrically connected to the control terminal of the transistor M4, the second terminal of the transistor M13 is coupled or electrically connected to the third reference voltage Vref, and the control terminal of the transistor M13 is coupled or electrically connected to the output terminal of the logic circuit 230. The input terminal of the logic circuit 230 receives the clock Φ1b. The logic circuit 230 outputs the control signal Ctrl according to the clock Φ1b, and the control signal Ctrl is used to turn on or off the transistor M13. The switch circuit SW4 corresponds to the switch 105 of FIG. 1.

As shown in FIG. 3, the control signal Ctrl is at the low level during the period td after the transition of the clock Φ1b from the low level to the high level (i.e., at the time point T1), and the control signal Ctrl is at the high level at other times. That is to say, the logic circuit 230 causes the control signal Ctrl to have a level transition (e.g., from the high level to the low level) when the clock Φ1b transitions from the low level to the high level (i.e., at the time point T1) and cause the control signal Ctrl to have another level transition (e.g., from the low level to the high level) before the clock Φ1b transitions from the high level to the low level (i.e., at the time point T2). The transistor M13 is turned on within the period td, giving rise to an instantaneous boost in the voltage at the control terminal of the transistor M4.

A simulation of the voltages at several nodes of the bootstrapped switch of FIG. 7 is similar to that of FIG. 4. At the time point T1, the transistor M13 is turned on to instantaneously pull up the voltage at the control terminal of the transistor M4 to a voltage that is substantially equal to the third reference voltage Vref, driving the transistor M4 to be turned on faster or easier.

In some embodiments, td<(T2−T1)/2. In other embodiments, the control signal Ctrl is a pulse (i.e., the period td is extremely short (td<<(T2−T1))).

As shown in FIG. 7, in some embodiments, the logic circuit 230 includes an NAND gate 232 and an inverter 234. The output terminal of the NAND gate 232 is coupled or electrically connected to the control terminal of the transistor M13, the first input terminal of the NAND gate 232 receives the clock Φ1b, and the second input terminal of the NAND gate 232 is coupled or electrically connected to the inverter 234. The input terminal of the inverter 234 is coupled or electrically connected to the first input terminal of the NAND gate 232 and the control terminal of the transistor M11.

Figure 8:
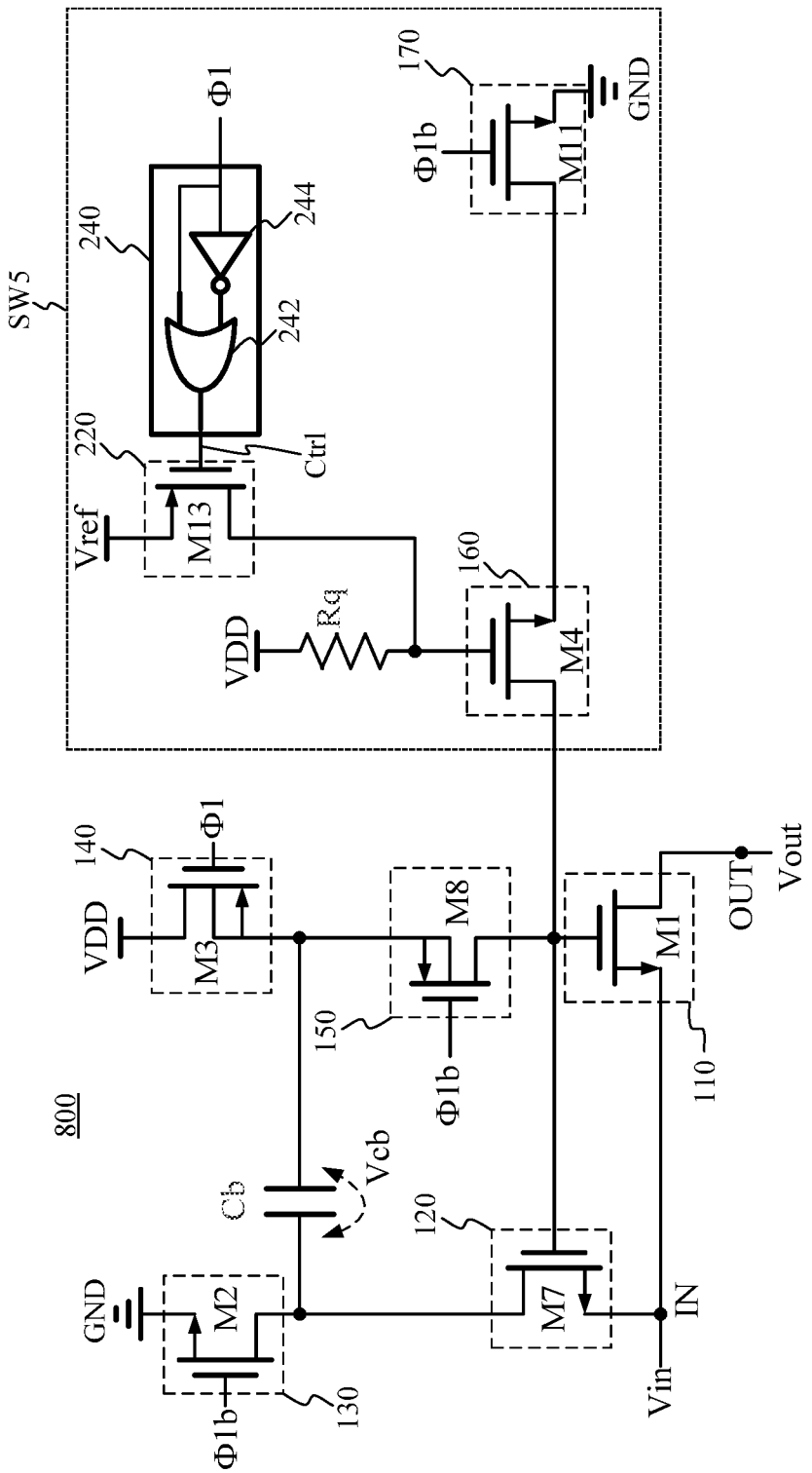
FIG. 8 is a circuit diagram of a bootstrapped switch according to another embodiment of the present invention.

FIG. 8 is a circuit diagram of a bootstrapped switch according to another embodiment of the present invention. The bootstrapped switch 800 is similar to the bootstrapped switch 700, except that the logic circuit 230 of the bootstrapped switch 700 is replaced by the logic circuit 240 of the bootstrapped switch 800. The function of logic circuit 240 is similar to that of the logic circuit 230. The logic circuit 240 includes an OR gate 242 and an inverter 244. The output terminal of the OR gate 242 is coupled or electrically connected to the control terminal of the transistor M13, the first input terminal of the OR gate 242 receives the inverted signal of the clock Φ1b (i.e., the clock Φ1), and the second input terminal of the OR gate 242 is coupled or electrically connected to the inverter 244. The input terminal of the inverter 244 is coupled or electrically connected to the first input terminal of the OR gate 242 and receives the clock Φ1. The switch circuit SW5 corresponds to the switch 105 of FIG. 1. In some embodiments, the low level of the logic circuit 240 is ground (e.g., the ground level GND), and the high level of the logic circuit 240 is 2*VDD.

Figure 9:
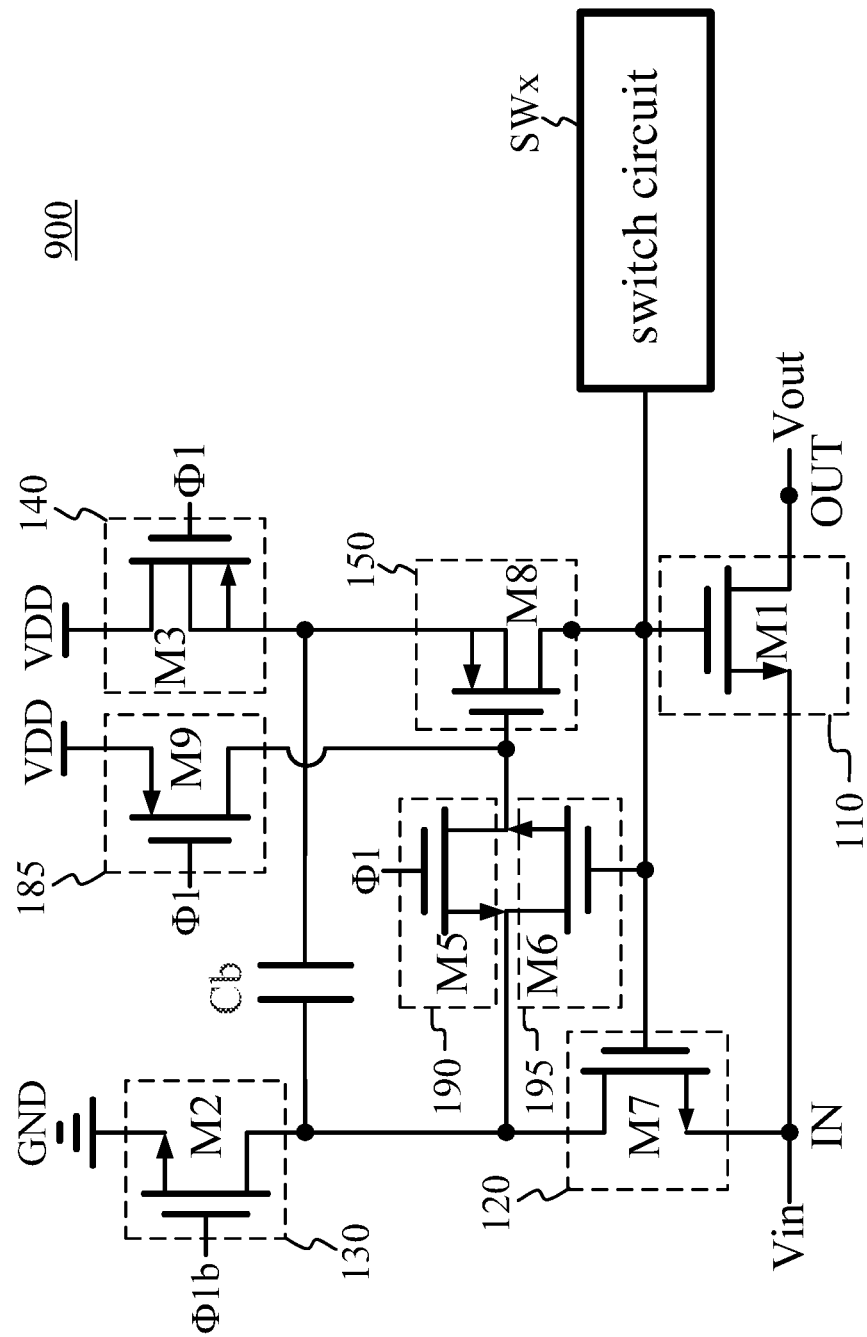
FIG. 9 is a circuit diagram of a bootstrapped switch according to another embodiment of the present invention.

FIG. 9 is a circuit diagram of a bootstrapped switch according to another embodiment of the present invention. The bootstrapped switch 900 includes a switch circuit SWx, a switch 185, a switch 190, and a switch 195. The switch 185, the switch 190, and the switch 195 are embodied by the transistor M9, the transistor M5, and the transistor M6, respectively. The switch 185 is coupled between the second reference voltage and the control terminal of the transistor M8, and is controlled by the clock Φ1. The switch 190 is coupled between the first terminal of the bootstrap capacitor Cb and the control terminal of the transistor M8, and is controlled by the clock Φ1. The switch 195 is coupled between the first terminal of the bootstrap capacitor Cb and the control terminal of the transistor M8, and the control terminal of the transistor M6 is electrically connected to the control terminal of the transistor M1 and the control terminal of the transistor M7. The transistor M5, the transistor M6, and the transistor M9 can provide overvoltage protection during the operation of the bootstrapped switch 500 to prolong the service life of the components. The operating principles of the transistor M5, the transistor M6, and the transistor M9 can be understood by people having ordinary skill in the art and are thus omitted for brevity. People having ordinary skill in the art can replace the switch circuit SWx of FIG. 9 with the switch circuit SW1, the switch circuit SW2, the switch circuit SW3, the switch circuit SW4, or the switch circuit SW5 of FIGS. 2 and 5-8.

To sum up, by adding some passive components or active components, the present invention can instantaneously boost the voltage at the control terminal of the transistor M4, so that the voltage at the control terminal of the transistor M1 decreases earlier and/or faster. Therefore, the bootstrapped switch of the present invention has a more rapid response speed (i.e., can operate at higher speeds).

In other embodiments, the PMOS transistors and the NMOS transistors in the foregoing embodiments may be replaced by the NMOS transistors and PMOS transistors, respectively. People having ordinary skill in the art know how to realize the embodiments discussed above by adjusting the phase or level of the clock Φ1 and the clock Φ1b accordingly and adjusting the first reference voltage, the second reference voltage, and the third reference voltage Vref accordingly.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A bootstrapped switch that receives an input voltage and outputs an output voltage, comprising:
   a first transistor having a first terminal, a second terminal, and a first control terminal, wherein the first transistor receives the input voltage at the first terminal and outputs the output voltage at the second terminal;
   a first capacitor having a third terminal and a fourth terminal;
   a second transistor having a fifth terminal, a sixth terminal, and a second control terminal, wherein the second transistor receives the input voltage at the fifth terminal, the sixth terminal is electrically connected to the third terminal of the first capacitor, and the second control terminal is electrically connected to the first control terminal of the first transistor;
   a first switch coupled between the third terminal of the first capacitor and a first reference voltage;

a second switch coupled between the fourth terminal of the first capacitor and a second reference voltage;

a third switch coupled between the fourth terminal of the first capacitor and the first control terminal of the first transistor;

a fourth switch coupled to the first control terminal of the first transistor and having a third control terminal;

a fifth switch coupled between the fourth switch and the first reference voltage and having a fourth control terminal;

a second capacitor having a seventh terminal and an eighth terminal, wherein the seventh terminal is coupled to the third control terminal, and the eighth terminal is coupled to the fourth control terminal; and a resistor coupled between the third control terminal and the second reference voltage.

2. The bootstrapped switch of claim 1, wherein the fourth switch is an N-channel MOSFET.

3. The bootstrapped switch of claim 1, wherein the fourth switch is a P-channel MOSFET, the bootstrapped switch further comprises an inverter circuit that is coupled between the fourth control terminal and the second capacitor.

4. The bootstrapped switch of claim 3 further comprising:
a sixth switch coupled between the first control terminal and the fifth switch and having a fifth control terminal that is coupled to the second reference voltage.

5. The bootstrapped switch of claim 4, wherein the resistor is a first resistor, the bootstrapped switch further comprising:

a third capacitor having a ninth terminal and a tenth terminal, wherein the ninth terminal is coupled to the fifth control terminal, and the tenth terminal is coupled to the fourth control terminal; and a second resistor coupled between the fifth control terminal and the second reference voltage.

* * * * *